United States Patent [19]

Nagaraj

[11] Patent Number: 5,532,629
[45] Date of Patent: Jul. 2, 1996

[54] BIPOLAR TRACK AND HOLD CIRCUIT

[75] Inventor: Krishnasawamy Nagaraj, Wescosville, Pa.

[73] Assignee: Texas Instruments Incorporated, Dallas, Tex.

[21] Appl. No.: 286,047

[22] Filed: Aug. 4, 1994

[51] Int. Cl.$^6$ .................................................. G11C 27/02
[52] U.S. Cl. .............................. 327/94; 327/96; 327/374; 327/579
[58] Field of Search .......................... 327/91, 94, 96, 327/111, 374, 376, 377, 579, 400

[56] References Cited

U.S. PATENT DOCUMENTS

| | | | |
|---|---|---|---|
| 3,643,169 | 2/1972 | Klein | 327/91 |
| 4,890,009 | 12/1989 | Miyazaki et al. | 327/579 |
| 5,315,168 | 5/1994 | Norton, Jr. | 327/91 |
| 5,343,084 | 8/1994 | Gens | 327/111 |
| 5,391,936 | 2/1995 | Soh | 327/94 |
| 5,410,195 | 4/1995 | Ichihara | 327/94 |

*Primary Examiner*—Timothy P. Callahan
*Assistant Examiner*—My-Trang N. Ton
*Attorney, Agent, or Firm*—John D. Crane; James C. Kesterson; Richard L. Donaldson

[57] ABSTRACT

A track and hold circuit including an input terminal $V_{IN}$, a first node, a second node and a capacitor $C_H$. A diode D connects between the first node and the input terminal $V_H$. Circuitry coupled to the first node makes the diode conductive during track mode of operation, indicated by a clock CK being at a first state, and non-conductive during hold mode of operation, indicated by a clock CK being at a second state. A transistor Q3 is coupled between said first node and said second node. The capacitor $C_H$ is connected to said second node. The transistor Q3 is operative to charge the capacitor $C_H$ during track mode and to isolate the capacitor $C_H$ from the input terminal $V_{IN}$ during hold mode. Additional circuitry coupled to said transistor Q3 senses the clock shifting from said first to said second state to rapidly discharge the inherent base/emitter capacitor of the transistor Q3 to thereby cause rapid turn off of the transistor Q3.

19 Claims, 2 Drawing Sheets

BIPOLAR TRACK AND HOLD CIRCUIT

FIELD OF THE INVENTION

This invention relates to the general field of electronic circuits useful in detecting analog signals and particularly to a track and hold circuit for tracking the amplitude of an analog signal in response to a clock pulse and holding the tracked amplitude until the next clock pulse.

BACKGROUND OF THE INVENTION

The ability to track and then hold the level of an analog waveform is often an essential function in the signal acquisition interface of a digital video system or a high speed instrument. Analog signals are also utilized in various applications including communications and computer disk drives, to name but two additional specific applications. The analog signals used in these and other applications are usually sampled at periodic intervals and the amplitude thereof detected and stored. The thus sampled analog signal resembles a stair step approximation of the original signal with steps occurring at the sampling or clocking rate. The circuits for producing the stair step approximation of the original signal are known as a track and hold circuits or, in the alternative, as sample and hold circuits.

Track and hold circuits typically have a storage device such as a capacitor which stores the amplitude of the signal being tracked. The circuit includes a switch which connects the storage device to the signal being tracked. During the time the switch is closed, the voltage on the storage device tracks the signal voltage as it changes. During the time that the switch is open, the storage device holds the voltage thereon at the level of the signal being tracked as of substantially at the instant the switch was opened.

While many track and hold circuits have been heretofore developed, some of these circuits have proved to be of lower speed than desired for high speed operation. This is particularly a problem with closed-loop configurations. A second problem encountered with prior art track and hold circuits is that they require relatively higher power levels than is desirable in some applications such as disk drives in portable or lap top computers. A third problem relates to the accuracy of the circuit to preserve the actual analog signal voltage which had been attained at the exact instant the circuit switches from its tracking mode to its hold mode.

Known track and hold circuits usually utilize a capacitor which is quickly charged to the input voltage during the clock pulse which defines the tracking period. At the trailing edge of the clock pulse, the capacitor stops being charged by the circuit and largely remains at the voltage of the input to the circuit until the next clock pulse arrives. This means that the circuit must shift very quickly from its tracking mode to its holding mode which requires very quickly disconnecting the capacitor charging circuit. The prior art circuits for accomplishing this shift, however, have generally been high power circuits which dissipate more energy than is desirable in applications such as portable or lap top computers and the like.

SUMMARY OF THE INVENTION

In overcoming the above noted and other problems related to prior art track and hold circuits, the present invention includes a capacitor for storing the level of the analog signal being tracked. The capacitor charging circuit is turned on by a track and hold clock being in one state. This causes the analog signal to be applied to the capacitor. The clock being in that one state also causes a latch to be set. When the clock pulse ends, the shift from the tracking to the hold mode occurs. This causes a first current to pass through a disconnect transistor whose function is to disconnect the capacitor from the analog signal. Once the disconnect has occurred, a sensor circuit detects this condition and resets the latch. Resetting the latch causes a lower current to pass through the disconnect transistor thereby resulting in lower power dissipation during the hold mode.

DESCRIPTION OF THE DRAWINGS

The above mentioned and other objects, advantages and features of the present invention are described below in connection with the drawings which form a part of the disclosure wherein.

DETAILED DESCRIPTION

Figure 1:
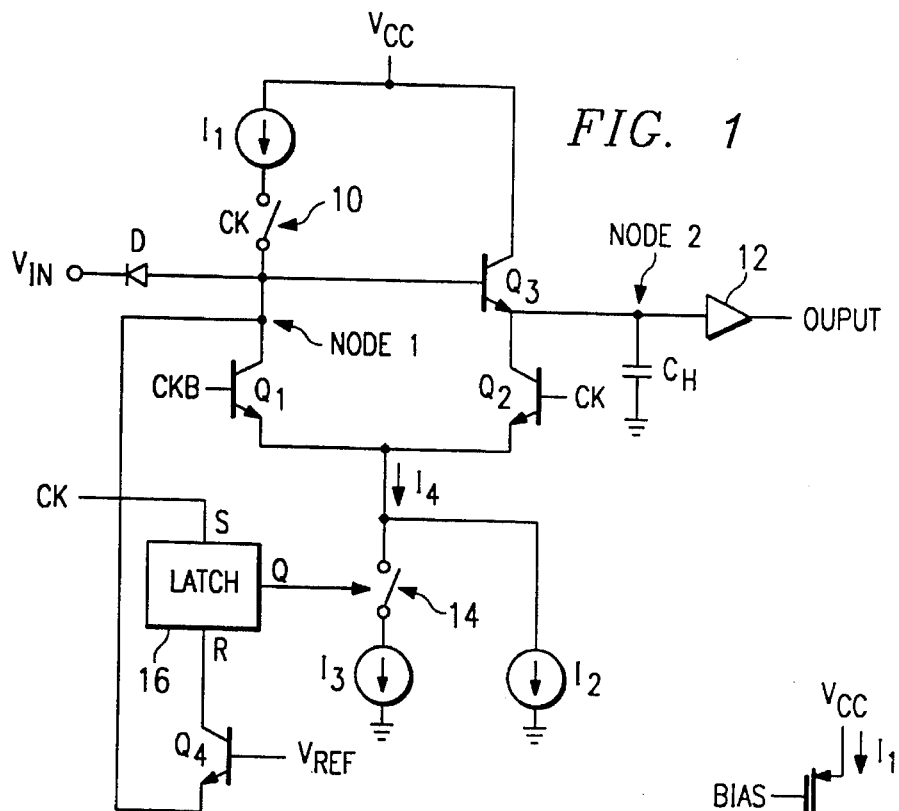
FIG. 1 is a schematic diagram of the track and hold circuit of the present invention.

The track and hold circuit of the present invention is illustrated schematically in FIG. 1. The analog signal which is to be tracked is input to the circuit at the input terminal labeled $V_{IN}$. The input terminal $V_{IN}$ is coupled to the cathode of a diode D. The anode of the diode D is coupled to node 1.

Several other elements of the present track and hold circuit are coupled to Node 1. A current source $I_4$ is connected in series with a switch 10 between Node 1 and a power source $V_{cc}$. Node 1 is also coupled to the base of transistor Q3, the collector of transistor Q1 and the emitter of transistor Q4.

Transistor Q3 has its collector coupled directly to the power source $V_{cc}$. The emitter of this transistor is coupled to Node 2 and to the collector of transistor Q2. This transistor Q3 provides the current for charging the storage capacitor $C_H$ which is used to hold the voltage of the analog input signal during the hold mode of the circuit and to track the analog input signal during the track mode of the circuit as will be described below in greater detail.

Node 2 also couples to an output buffer 12 which isolates Node 2 from the circuit output which may be coupled to other components (not shown).

Figure 2:
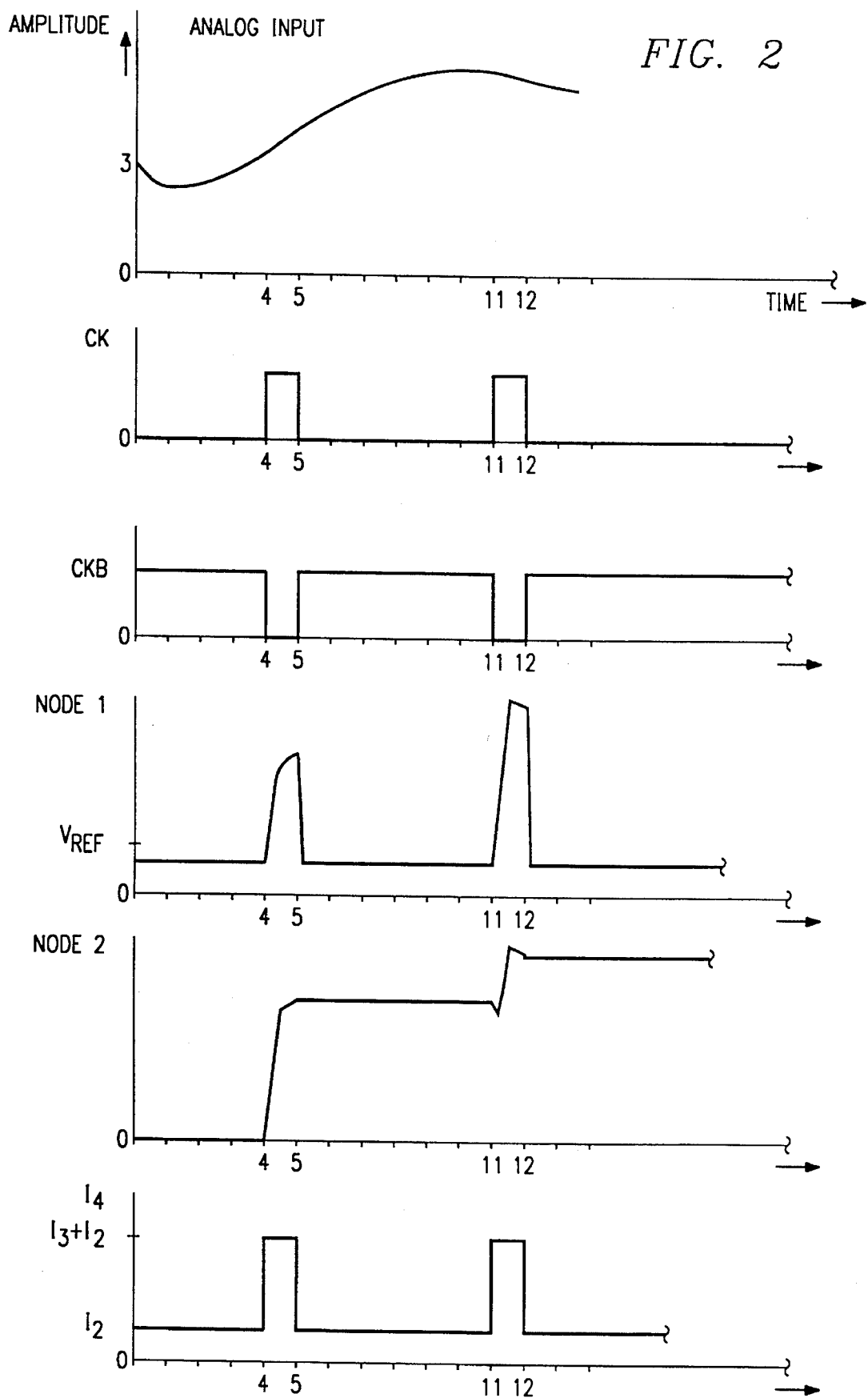
FIG. 2 shows pulse diagrams for various points in the circuit illustrated in FIG. 1.

Transistor Q1 has its base coupled to an input clock signal CKB. Transistor Q2 has its base coupled to an input clock signal CK. As illustrated in FIG. 2, CK is a periodic positive pulse signal which, in typical applications of the present invention is at a typical frequency of about 150 MHz and has its positive portion extending over about ⅛ of each cycle. This portion of the clock cycle corresponds to the time when the circuit is in "track" mode. When "track" mode ends. It is also desirable that the fall time of the pulse for clock CK be in the order of 100 pico seconds. This prevents changes in the analog input signal from being reflected in the voltage stored by the storage capacitor $C_H$. The exact frequency of this signal is not particularly critical, however, it must be at least 2 times the frequency of the analog input signal being tracked. The exact portion of the clock which is positive is also not critical although it must be sufficiently long so as to permit the storage capacitor $C_H$ to begin tracking the; analog input signal before returning to zero.

The clock CKB, as illustrated in FIG. 2, is the inverse of the clock CK. In other words, when CK is high, CKB is low and vice versa. These two clocks can be used in various manners in the illustrated implementation of the invention. Those skilled in the art will recognize that different implementations may require the use of the inverse of the clock illustrated in the representative embodiments illustrated if FIGS. 3–5.

The emitters of transistors Q1 and Q2 are connected together and both are coupled to a second current source $I_2$. A third current source $I_3$ is connected in series with a switch 14 between ground and the connection node connecting the emitters of Q1 and Q2 together. The switch 14 is closed whenever a latch 16 is set. The latch 16 is set in response to the clock pulse signal CK going high at the beginning of the track mode of operation. Latch 16, however, is reset at the conclusion of the track mode of operation. This will occur when the voltage at Node 1, which couples to the emitter of Q4, is one diode drop (i.e., about 0.7 volts) below the reference voltage $V_{ref}$ which is applied to the base of transistor Q4. Hence transistor Q4 operates as a voltage sensor to determine when the voltage at Node 1 has fallen sufficiently to assure that transistor Q3 is turned off thereby disconnecting Node 1 from Node 2.

The operation of the circuit of FIG. 1 will be discussed in connection with the pulse diagrams illustrated in FIG. 2. At time 0, the arbitrarily illustrated analog input signal has an amplitude of 3. The clock CK is low and the clock CKB is high. The voltage at Node 1 is one diode drop (about 0.7 volts) below the reference voltage $V_{ref}$. The voltage at Node 2 is zero and the current $I_{Q4}$ through transistor Q4 is $I_2$.

When the clock pulse CK arrives at time 4 which designates the beginning of track mode of operation, the level of the voltage on the clock line CK goes to a high level suitable for gating the circuits coupled to that line. Correspondingly, the voltage on the clock line CKB goes low. The voltage at Node 1 begins to rapidly rise because switch 10 was closed by clock CK and transistor Q1 has been turned off by clock CKB. At the same time, diode D is forward biased (i.e., made conductive) so that signals appearing on the input terminal $V_{in}$ will be coupled to Node 1. The voltage at Node 1 rises until it is one diode drop higher than the voltage at the input terminal $V_{in}$. Thereafter, the voltage on Node 1 tracks the voltage at the input terminal $V_{in}$, i.e., it is equal to $V_{in}+0.7$ volts. This tracking continues until the clock pulse CK returns to, its low level indicating that hold mode of operation has begun.

At the same time that the voltage at Node 1 is rising beginning at time 4, the voltage at Node 2 begins to rise rapidly as well. This is caused by the fact that the transistor Q3 is turned on by the rising voltage at Node 1 and transistor Q2 is also turned on by the clock pulse CK. During this time, the voltage across capacitor $C_H$, which is connected between Node 2 and ground, rises. The voltage across $C_H$ rises until it reaches the voltage at $V_{in}$. Thereafter, the voltage across capacitor $C_H$ tracks the voltage at $V_{in}$.

When the clock pulse CK goes low at time 5 which corresponds to the beginning of hold mode of operation, the switch 10 is opened thereby removing the current source $I_1$ from Node 1. This causes the diode D to become non-conductive. At the same time, the clock CK goes low, causing the transistor Q2 to begin to turn off, and transistor Q1 is turned on by the clock CKB going high. This actuation of transistor Q1 provides a mechanism for rapidly discharging the base-emitter capacitor of transistor Q3 with a current equal to $I_2+I_3$ thereby very rapidly turning transistor Q3 off. Thus, two actions combine to quickly isolate changes of voltage at the input terminal form the storage capacitor $C_H$, namely: (1). Accelerating the turn off of transistor Q3 following the clock transition from the track to the hold state and (2). Removing of the forward bias on the diode D. In the illustrated embodiment, Q3 turns off in about 100 pico seconds after the pulse CK goes low. This rapid turnoff of transistor Q3 is necessary in order to minimize the effect of changes of voltage at Node 1 being reflected in the voltage across the storage capacitor $C_H$.

When the voltage at Node 1 falls to a level of $V_{ref}-0.7$ volts, a current starts to flow through transistor Q4. This current causes the latch 16 to be reset. This causes the switch 14 to open and disconnect the current source $I_3$ from the circuit as it is no longer needed to help in turning off transistor Q3. As a result, the circuit power dissipation during the portion of hold mode of operation which occurs following transistor Q3 having turned off is reduced to a second and lower level than the power dissipation during track mode of operation.

Figure 3:
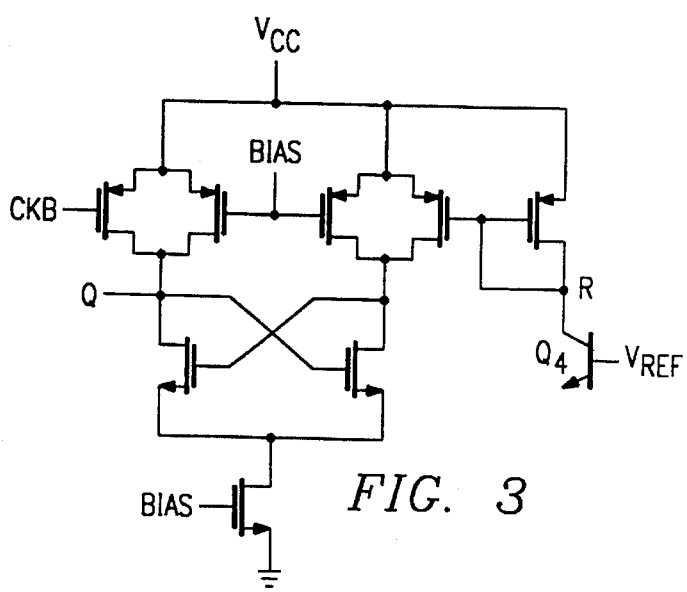
FIG. 3 illustrates a typical latch which may be used in the circuit of FIG. 1.

Referring now to FIG. 3, a circuit is shown which will function as the latch 16 and the associated circuits coupled to transistor Q4. As those of skill in the art will recognize, the configuration of FIG. 3 is but one way for implementing a latch and that numerous other designs can readily by substituted therefor which will perform in the same manner. Any of the possible alternative designs which will function in the manner described in connection with FIG. 1 will be suitable replacements for the configuration of FIG. 3.

Figure 4:
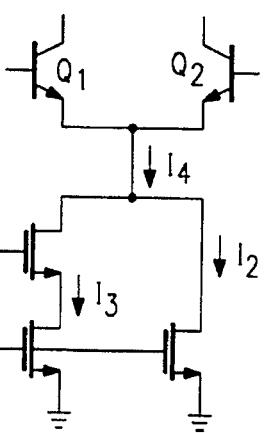
FIG. 4 illustrates the current source $I_1$ and the switch associated therewith in FIG. 1.

FIG. 4 illustrates a circuit for implementing the switch 10 and the current source $I_1$. Those of skill in the art will recognize that this implementation is but one of many possible implementations of a switch in series with a current source and that any other design that performs the functions thereof as described in connection with FIG. 1 may be utilized as a substitute therefor.

Figure 5:
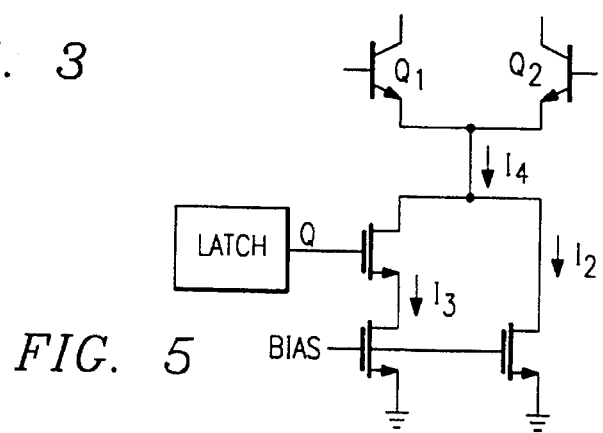
FIG. 5 illustrates the current sources $I_2$ and $I_3$ and the switch associated with $I_3$ for the circuit of FIG. 1

FIG. 5 illustrates a circuit for implementing the switch 14 and the current sources $I_2$ and $I_3$. Those of skill in the art will recognize that this implementation is but one of many possible implementations of a switch in series with a current source; in parallel with a second current source and that any other design that performs the functions thereof as described in connection with FIG. 1 may be utilized as a substitute therefor. It will also be recognized that the bias used for setting $I_2$ and $I_3$ need not be the same bias but could be a different bias supply although having but a single bias is desirable.

Those of skill in the art will recognize that the value of the bias voltages for the; circuits in FIG. 4 and 5 as well as the reference voltage $V_{ref}$ are selected to optimize the performance of the circuit illustrated in FIG. 1. Those of skill in the art will also recognize that the frequency of the clock pulse CK can be changed from the approximate 150 MHz utilized by the circuit illustrated.

What is claimed is:

1. A track and hold circuit comprising, in combination:
   an input terminal for receiving an externally generated analog signal;
   a charge storing capacitor;
   a clock input for receiving an externally generated periodic clock signal which changes periodically between a first level and a second level;

a switch responsive to said clock being at said first level to connect said input terminal to said capacitor and for disconnecting said capacitor from said input terminal when said clock is at its second level, said switch including a transistor coupled to said capacitor which is conductive when said clock is at said first level; and means responsive to detecting said clock changing from said first level to said second level to accelerate disconnecting of said input terminal from said capacitor by rapidly discharging the inherent base-emitter capacitor of said transistor.

2. The track and hold circuit of claim 1 additionally including a buffer amplifier with an input and an output, the input of said buffer amplifier is coupled to said capacitor and the output of said buffer amplifier provides a track and hold circuit output which isolates the capacitor from other components connected to said track and hold circuit.

3. The track and hold circuit of claim 1 wherein said means responsive to detecting includes means for detecting when said capacitor is disconnected from said input terminal.

4. The track and hold circuit of claim 1 including a latch set when said clock is at said first level and reset after said clock switches to its second level and said capacitor is disconnected from said input terminal.

5. The track and hold circuit of claim 1 including a diode disposed between said input terminal and said capacitor which is conductive while said clock is at said first level and non-conductive while said clock is at said second level.

6. The track and hold circuit of claim 1 including at least two current sources, one said current source being operative while said clock signal is at said first level and a second current source being operative while said clock signal transitions from said first level to said second level.

7. A track and hold circuit comprising, in combination:

an input terminal for receiving an externally generated analog signal;

a charge storing capacitor;

a clock input for receiving an externally generated clock signal having two levels, a first level and a second level;

a switching network disposed between said capacitor and said input terminal, said switching network being operative at a first power level to connect said input terminal to said capacitor when said clock is at said first level, being operative in response to said clock transitioning from said first level to said second level to disconnect said capacitor from said input terminal and being operative at a second power level less than said first power level in response to said capacitor being disconnected from said input terminal to block connection of said capacitor to said input terminal while said clock is at said second level, said switching network includes a latch set when said clock is at said first level and resets when said clock is at said second level, said setting of said latch initiating operation at said first power level and resetting said latch initiating operation at said second power level.

8. The track and hold circuit of claim 7 additionally including a buffer amplifier with an input and an output, the input of said buffer amplifier is coupled to said capacitor and the output of said buffer amplifier provides a track and hold circuit output which isolates the capacitor from other components connected to said track and hold circuit.

9. A track and hold circuit comprising, in combination:

an input terminal for receiving an externally generated analog signal;

a charge storing capacitor;

a clock input for receiving an externally generated clock signal having two levels, a first level and a second level;

a switching network disposed between said capacitor and said input terminal, said switching network being operative at a first power level to connect said input terminal to said capacitor when said clock is at said first level, being operative in response to said clock transitioning from said first level to said second level to disconnect said capacitor from said input terminal and being operative at a second power level less than said first power level in response to said capacitor being disconnected from said input terminal to block connection of said capacitor to said input terminal while said clock is at said second level, said switching network includes a diode which is conductive when said clock is at said first level to permit voltage changes at said input terminal to be transferred to said capacitor and for being non-conductive when said clock is at said second level to isolate voltage changes at said input from affecting the voltage on said capacitor.

10. A track and hold circuit comprising, in combination:

an input terminal for receiving an externally generated analog signal;

a charge storing capacitor;

a clock input for receiving an externally generated clock signal having two levels, a first level and a second level;

a switching network disposed between said capacitor and said input terminal, said switching network being operative at a first power level to connect said input terminal to said capacitor when said clock is at said first level, being operative in response to said clock transitioning from said first level to said second level to disconnect said capacitor from said input terminal and being operative at a second power level less than said first power level in response to said capacitor being disconnected from said input terminal to block connection of said capacitor to said input terminal while said clock is at said second level, said switching network includes two current sources, the first said current source being operative at all times while the second said current source being operative only while said capacitor is being disconnected in response to the transitioning of said clock from said first level to said second level.

11. A track and hold circuit comprising, in combination:

an input terminal for receiving an externally generated analog signal that is to be tracked and held;

a first and a second node;

a clock input terminal for receiving a periodic clock signal for periodically defining a time during which said track and hold circuit operates in track mode and a time during which said track and hold circuit operates in hold mode;

a selectively actuated coupling means for providing a connection between said first node and said input terminal to selectively couple said analog signal to said first node during said tracking mode of operation of said track and hold circuit and to isolate said input terminal from said first node during said hold mode of operation of said track and hold circuit;

a first transistor connected in series at a connection node with a first current source, said first transistor and said first current source being connected between said first node and ground, said first transistor being conductive only during said hold mode;

a second transistor connected between said second node and said connection node between said first transistor and said first current source, said second transistor being conductive only during said track mode;

a third transistor the emitter and collector of said third transistor being connected between said second node and a voltage source and the base of said third transistor being connected to said first node;

a capacitor connected between said second node and ground;

a latch circuit which is set by the transition of the clock at said clock input terminal from a level indicating said hold mode to a level indicating said track mode, said latch circuit including a reset input for receiving a reset signal for resetting said latch;

a switch series connected with a second current source between said connection node and ground, said switch being closed whenever said latch is set; and a level sensing circuit coupled between said first node and said reset input of said latch to reset said latch whenever the voltage at said first node falls to a preselected level to thereby disconnect said second current source from said track and hold circuit.

12. The track and hold circuit of claim 11 additionally including a buffer amplifier with an input and an output, the input of said buffer amplifier is coupled to said capacitor and the output of said buffer amplifier provides a track and hold circuit output which isolates the capacitor from other components connected to said track and hold circuit.

13. The track and hold circuit of claim 12 wherein said level sensing circuit includes a fourth transistor connected between said first node and the reset of said latch circuit, the base of said fourth transistor being connected to a reference bias supply, said fourth transistor becoming conductive when the voltage at said first node falls below said reference bias supply voltage minus a diode voltage drop, said fourth transistor becoming conductive being operative to reset said latch.

14. The track and hold circuit of claim 12 wherein said selectively actuated coupling means includes a diode and means to bias the diode into conduction during track mode and to bias the diode into non-conduction during hold mode.

15. The track and hold circuit of claim 14 wherein the anode of said diode is connected to said first node and the cathode of said diode is connected to said input terminal.

16. The track and hold circuit of claim 15 wherein said level sensing circuit includes a fourth transistor connected between said first node and the reset of said latch circuit, the base of said fourth transistor being connected to a reference bias supply, said fourth transistor becoming conductive when the voltage at said first node falls below said reference bias supply voltage minus a diode voltage drop, said fourth transistor becoming conductive being operative to reset said latch.

17. The track and hold circuit of claim 14 wherein said level sensing circuit includes a fourth transistor connected between said first node and the reset of said latch circuit, the base of said fourth transistor being connected to a reference bias supply, said fourth transistor becoming conductive when the voltage at said first node falls below said reference bias supply voltage minus a diode voltage drop, said fourth transistor becoming conductive being operative to reset said latch.

18. The track and hold circuit of claim 17 additionally including a buffer amplifier with an input and an output, the input of said buffer amplifier is coupled to said capacitor and the output of said buffer amplifier provides a track and hold circuit output which isolates the capacitor from other components connected to said track and hold circuit.

19. The track and hold circuit of claim 11 wherein said level sensing circuit includes a fourth transistor connected between said first node and the reset of said latch circuit, the base of said fourth transistor being connected to a reference bias supply, said fourth transistor becoming conductive when the voltage at said first node falls below said reference bias supply voltage minus a diode voltage drop, said fourth transistor becoming conductive being operative to reset said latch.

* * * * *